(12) United States Patent
Echigo et al.

(10) Patent No.: US 7,384,683 B2
(45) Date of Patent: Jun. 10, 2008

(54) SUBSTRATE FOR FLEXIBLE PRINTED WIRING BOARD AND METHOD FOR MANUFACTURING THE SAME

(75) Inventors: Yoshiaki Echigo, Uji (JP); Jusirou Eguchi, Uji (JP); Akira Shigeta, Uji (JP); Makoto Uchida, Saitama (JP); Shigeru Moteki, Annaka (JP)

(73) Assignees: Unitika Ltd., Hyogo (JP); Nippon Kayaku Kabushiki Kaisha, Tokyo (JP)

( * ) Notice: Subject to any disclaimer, the term of this patent is extended or adjusted under 35 U.S.C. 154(b) by 44 days.

(21) Appl. No.: 10/571,084

(22) PCT Filed: Sep. 10, 2004

(86) PCT No.: PCT/JP2004/013603

§ 371 (c)(1),
(2), (4) Date: Mar. 6, 2006

(87) PCT Pub. No.: WO2005/027597

PCT Pub. Date: Mar. 24, 2005

(65) Prior Publication Data

US 2007/0071984 A1    Mar. 29, 2007

(30) Foreign Application Priority Data

Sep. 10, 2003 (JP) ............................ 2003-317635

(51) Int. Cl.
*B32B 3/00* (2006.01)
*H05K 1/00* (2006.01)
*C09J 5/10* (2006.01)

(52) U.S. Cl. ...................... 428/209; 428/458; 174/254; 174/258; 174/259; 156/305; 156/306.6; 156/330; 361/750

(58) Field of Classification Search ................ 428/209, 428/901, 458; 174/255, 254, 258–259; 156/305, 156/330, 306.6; 361/750
See application file for complete search history.

(56) References Cited

U.S. PATENT DOCUMENTS

| 3,717,543 | A | * | 2/1973 | Sinclair et al. ............. 428/416 |
| 4,626,474 | A | * | 12/1986 | Kim ........................... 428/416 |
| 5,103,293 | A | * | 4/1992 | Bonafino et al. ............ 257/702 |
| 5,234,522 | A | * | 8/1993 | Suzuki et al. ................ 156/249 |
| 5,637,382 | A | * | 6/1997 | Kataoka et al. ............. 428/209 |
| 6,187,416 | B1 | * | 2/2001 | Satoh et al. ................ 428/209 |
| 6,217,996 | B1 | * | 4/2001 | Yamamoto et al. ......... 428/220 |
| 6,340,518 | B1 | * | 1/2002 | Kitahara et al. ............. 428/215 |
| 6,521,838 | B2 | * | 2/2003 | Yamanobe et al. ...... 174/117 F |
| 6,548,180 | B2 | * | 4/2003 | Yamamoto et al. ...... 428/473.5 |
| 6,841,738 | B2 | * | 1/2005 | Michiwaki et al. ......... 174/254 |
| 6,924,024 | B2 | * | 8/2005 | Narui et al. ................ 428/141 |
| 6,962,726 | B2 | * | 11/2005 | Shigeta et al. ............. 427/96.1 |
| 7,038,128 | B2 | * | 5/2006 | Haghiri-Tehrani et al. .. 174/524 |
| 7,220,490 | B2 | * | 5/2007 | Dueber et al. .............. 428/447 |

FOREIGN PATENT DOCUMENTS

| JP | 55-153393 | 11/1980 |
| JP | 2003-026773 | 1/2003 |

* cited by examiner

*Primary Examiner*—Cathy F. Lam
(74) *Attorney, Agent, or Firm*—Fildes & Outland, P.C.

(57) ABSTRACT

The present invention provides a substrate for a flexible printed wiring board including an adhesive layer containing an epoxy resin composition, insulating layers respectively stacked on both sides of the adhesive layer and formed with a pair of films containing a nonthermoplastic polyimide resin, and conductor layers respectively disposed on the outer surfaces of the films. The total thickness of the insulating layers respectively stacked on both sides of the adhesive layer is 10 to 100 μm and 2 to 10 times the thickness of the adhesive layer. The mutual adhesion strength between the insulating layers through the intermediary of the adhesive layer is 7.0 N/cm or more.

6 Claims, No Drawings

SUBSTRATE FOR FLEXIBLE PRINTED WIRING BOARD AND METHOD FOR MANUFACTURING THE SAME

TECHNICAL FIELD

The present invention relates to a substrate for a flexible printed wiring board and a method for manufacturing the substrate, in particular, a substrate for a flexible wiring board which substrate does not develop curling, twisting, warping or the like after formation of circuits, and is additionally excellent in heat resistance, dimensional stability, electric properties and the like, and a method for manufacturing the substrate.

BACKGROUND ART

Known substrates for flexible printed wiring boards are manufactured by bonding an insulator made of a nonthermoplastic polyimide film and a conductor to each other through the intermediary of an epoxy resin adhesive, an acrylic resin adhesive or the like. Known among such substrates are a substrate for a three layer-structured single-sided flexible printed wiring board (hereinafter referred to as "single-sided substrate") in which substrate a conductor is disposed on one side of an insulator through the intermediary of an adhesive layer, and a substrate for a five layer-structured doubled-sided flexible printed wiring board (hereinafter referred to as a "double-sided substrate") in which substrate two conductors are each stacked on one of both sides of an insulator through the intermediary of an adhesive.

However, the known substrates for flexible printed wiring boards have problems in that in both the single-sided substrate and the double-sided substrate, an adhesive layer is present between a conductor and an insulator, and hence the heat resistance, flame retardancy, electric properties and the like are degraded. Additionally, there is a problem that the rate of dimensional change is large when the conductor is etched and the substrate is subjected to some type of heat treatment, leading to troubles caused in the subsequent processes.

For the purpose of solving the above described problems, as for the single-sided substrate, there has been developed a method in which the nonthermoplastic polyimide resin layer is formed directly on the conductor without any adhesive layer between the conductor and the insulator (for example, JP-A-60-157286, JP-A-1-245586, JP-A-4-274382 and JP-A-8-250860).

On the other hand, as for the double-sided substrate, there has been proposed a method in which the above described problems are intended to solve by using a thermoplastic polyimide capable of thermocompression bonding for an adhesive layer for the purpose of adhering the nonthermoplastic polyimide film and the conductor to each other (for example, JP-A-2000-103010, JP-A-2001-270033, JP-A-2001-270034, JP-A-2001-270035, JP-A-2001-270037 and JP-A-2001-270039).

However, in the configuration, it is not the nonthermoplastic polyimide but the thermoplastic polymer that is directly in contact with the conductors, so that the rate of dimensional change becomes large when the substrate is subjected to some type of heat treatment, and consequently the configuration cannot sufficiently solve the above described problems.

DISCLOSURE OF THE INVENTION

An object of the present invention is to provide, through solving the above described problems, a substrate with conductors disposed on both sides thereof for a flexible printed wiring board which substrate can suppress the development of the curling, twisting, warping or the like caused by formation of circuits and heat treatment, and is excellent additionally in heat resistance, flame retardancy, dimensional stability, electric properties and the like, and a method for manufacturing the substrate.

The present inventors has perfected the present invention by finding that the above described problems can be solved by forming insulating layers directly on the conductors without making adhesive layers intervene therebetween, and by mutually integrating the insulating layers with an adhesive layer made of a specific thermosetting resin.

The substrate for a flexible printed wiring board of the present invention has a configuration in which films made of a nonthermoplastic polyimide resin to form insulating layers are stacked respectively on both sides of an adhesive layer made of an epoxy resin composition, conductor layers are disposed on the outer surfaces of the respective films, and the total thickness of the insulating layers disposed on both sides of the adhesive layer is 10 to 100 μm and 2 to 10 times the thickness of the adhesive layer, and the mutual adhesion strength between the insulating layers is 7.0 N/cm or more.

The method for manufacturing the substrate for a flexible printed wiring board of the present invention is a method in which, a varnish made of an epoxy resin composition is applied onto the film surface of at least one insulating layer of a first insulating layer which is a film made of a nonthermoplastic polyimide resin and has a conductor layer stacked on one side thereof and a second insulating layer which is a film made of a nonthermoplastic polyimide resin and has a conductor layer stacked on one side thereof, and the first and second insulating layers are stacked to be pressure bonded to each other in a heated atmosphere in such a way that the film surfaces of these insulating layers face each other.

Another method for manufacturing the substrate for a flexible printed wiring board of the present invention is a method in which, a 5 to 50 μm thick film insulating layer made of a nonthermoplastic polyimide resin with a conductor layer stacked on one side thereof is prepared; a laminate film with an adhesive layer formed therein is prepared by applying a varnish made of an epoxy resin composition on the film surface of the insulating layer so as for the varnish layer to be 0.1 to 0.5 time as thick as the insulating layer and by subsequently drying the varnish layer; and two sheets of the thus prepared laminate film are used and the sheets are stacked so as for the adhesive layers thereof to face each other to be pressure bonded to each other in a heated atmosphere.

According to the present invention, in a double-sided substrate for a flexible printed wiring board, by forming the insulating layers directly on the conductor layers without disposing the adhesive layers between the conductor layers and the insulating layers and by integrating both of the insulating layers through the intermediary of a specific adhesive layer, there can be obtained a substrate excellent in heat resistance, flame retardancy and electric properties, and satisfactory in dimensional stability, and additionally there can be obtained a mutual adhesion strength between the insulating layers appropriate for a substrate for a flexible printed wiring board. Additionally, by regulating the thicknesses of the insulating layers and the adhesive layer, the electric insulation and the mutual adhesion between the insulating layers are improved, and moreover, mechanical properties such as dimensional stability, curling properties, and endurance to repeated bending are further improved, so that there can be actualized a satisfactory substrate for a flexible printed wiring board which substrate does not develop curling, twisting and warping even when subjected to the etching treatment for forming circuits and some other heat treatments.

BEST MODE FOR CARRYING OUT THE INVENTION

In the substrate for a flexible printed wiring board of the present invention, films to form insulating layers made of a nonthermoplastic polyimide resin are respectively stacked on both sides of an adhesive layer made of an epoxy resin composition, and a conductor layer is disposed on the outer surface of each of the films. By forming the insulating layers directly on the conductor layers without making adhesive layers intervene therebetween, there is obtained a substrate for a flexible printed wiring board excellent in heat resistance, flame retardancy and electric properties, and satisfactory in dimensional stability even in a high temperature atmosphere. Additionally, the substrate can suppress the development of curling, twisting and warping when subjected to etching and some other heat treatments.

Additionally, by integrating, with a specific adhesive layer, one of the insulating layers and the other thereof, there can be obtained a mutual adhesion strength between the insulating layers appropriate for a substrate for a flexible printed wiring board. Specifically, the mutual adhesion strength between the insulating layers is to be 7.0 N/cm or more, and is more preferably 10 N/cm or more. When the mutual adhesion strength between the insulating layers is less than 7.0 N/cm, the substrate lacks in practicality as a substrate for a flexible printed wiring board.

For the substrate for a flexible printed wiring board of the present invention, the total thickness of the insulating layers disposed on both sides of the adhesive layer be 10 to 100 µm, the total thickness preferably falls in a range from 10 to 30 µm. When the total thickness of the insulating layers is less than 10 µm, the electric insulation and the like come to be insufficient, and the reliability as a substrate for a flexible printed wiring board is impaired. On the other hands, when the total thickness of the insulating layers exceeds 100 µm, the mechanical properties, including the endurance to repeated bending, as a substrate for a flexible printed wiring board are impaired.

The total thickness of the insulating layers is to be 2 to 10 times and is preferably 2 to 5 times the thickness of the adhesive layer. When the total thickness of the insulating layers is less than 2 times the thickness of the adhesive layer, the coefficient of linear thermal expansion (CTE) of each of the insulating layers tends to be increased to degrade the dimensional stability. When the total thickness of the insulating layers exceeds 10 times the thickness of the adhesive layer, the mutual adhesion strength between the insulating layers is degraded.

No particular constraint is imposed on the individual thicknesses of the insulating layers disposed on both sides of the adhesive layer as long as the thicknesses fall in total, namely, as the sum of the thicknesses of both insulating layers, within the above described ranges; however, the thicknesses concerned are preferably the same for the purpose of preventing curling, twisting, warping and the like.

By making the insulating layers and the adhesive layer respectively have the specific thicknesses, the electric insulation properties and the mechanical properties including the endurance to repeated bending are further improved. Additionally, because the dimensional stability is further improved, the development of curling, twisting, warping and the like can be further suppressed even when the substrate is subjected to etching for forming circuits in the conductor layers and various types of heat treatments in the steps subsequent to circuit formation. Consequently, the substrate for a flexible printed wiring board of the present invention permits not only satisfactory mounting of electronic elements or the like but attaining a high mounting density.

As the epoxy resin composition to form the adhesive layer in the substrate for the flexible printed wiring board, an epoxy resin including a phenolic hydroxy group-containing polyamide, an aromatic epoxy resin and a curing agent can be preferably used. The use of the resin composition having such a configuration as an adhesive can attain a value as high as 7.0 N/cm or more as the mutual adhesion strength between the insulating layers as described above.

The substrate for a flexible printed wiring board of the present invention constituted as described above can be obtained by means of the manufacturing methods of the present invention.

The first manufacturing method of the present invention will be described below.

There are used a first insulating layer which is a film made of a nonthermoplastic polyimide resin and has a conductor layer stacked on one side of the film and a second insulating layer which is a film made of a nonthermoplastic polyimide resin and has a conductor layer stacked on one side of the film. A varnish made of an epoxy resin composition is applied onto the film surface of at least one of the first and second insulating layers. Then, the first and second insulating layers are stacked on each other so as for the film surfaces thereof to face each other to be pressure bonded to each other in a heated atmosphere for integration.

In this method, the total thickness of the first and second insulating layers, namely, the sum of the thicknesses of both insulating layers may be 10 to 100 µm; the thicknesses of the individual insulating layers may be the same or different from each other. Additionally, no particular constraint is imposed on the thickness of the varnish coating as long as the total thickness of the insulating layers is 2 to 10 times the thickness of the adhesive layer as measured after drying and a value of 7.0 N/cm or more is attained as the mutual adhesion strength between the insulating layers.

The varnish to be applied onto the film surface may be applied onto at least one of the pair of insulating layers, or may be applied onto both of the insulating layers. When the varnish is applied onto both of the insulating layers, the thicknesses of the varnish coatings may be the same or different from each other.

Next, the second manufacturing method of the present invention will be described below.

There is used an insulating layer which is a 5 to 50 µm thick film made of a nonthermoplastic polyimide resin and has a conductor layer stacked on one side of the film. When the film thickness is less than 5 µm, the electric insulation and the like come to be insufficient and the reliability as a substrate for a flexible printed wiring board is impaired, while when the thickness of the insulating layer exceeds 50 µm, the mechanical properties including the endurance to repeated bending as a substrate for a flexible printed wiring board are impaired. Accordingly, the film thickness preferably falls in a range from 5 to 15 µm.

The varnish made of the epoxy resin composition is applied onto the film surface of the insulating layer so as for the varnish coating to have a thickness of 0.1 to 0.5 time the thickness of the insulating layer, and then dried to form an adhesive layer; thus, a three layer-structured laminate film including a conductor layer/insulating layer/adhesive layer configuration is prepared. In this connection, when the thickness of the adhesive layer is less than 0.1 time the thickness of the insulating layer, mutual bonding of two of the laminate films, as will be described later, does not attain a sufficient mutual adhesion strength between the insulating layers. On the other hand, when the thickness of the adhesive layer exceeds 0.5 time the thickness of the insulating layer, the coefficient of linear thermal expansion (CTE) of the insulating layer tends to be increased, and not only the dimensional stability of the substrate is thereby degraded, but the mechanical properties including the endurance to repeated bending as a substrate for a flexible printed wiring board are impaired.

By using two sheets of the three layer-structured laminate film prepared as described above, the two sheets are stacked so as for the adhesive layers to face each other and are pressure bonded in a heated atmosphere for integration to yield a substrate for a flexible printed wiring board of the present invention.

According to the first and second manufacturing methods of the present invention, the substrates for flexible printed wiring boards of the present invention can be easily manufactured.

In the aforementioned manufacturing methods, the temperature for drying the varnish is preferably 150° C. or lower, and more preferably 100° C. or lower. For the purpose of industrially applying the varnish, there can be used as a coating machine a die coater, a multilayer die coater, a gravure coater, a comma coater, a reverse roll coater, a doctor blade coater or the like.

Examples of the conductor constituting the conductor layer of the substrate for a flexible printed wiring board of the present invention include metal foils made of conductive materials such as copper, aluminum, iron, silver, palladium, nickel, chromium, molybdenum, tungsten, and alloys of these metals. Most preferable among these is copper foil from the viewpoint of conductivity.

Chemical or mechanical surface treatment may be made on the insulating layer formation surface in the conductor layer for the purpose of improving the adhesion to the insulating layer. Examples of the chemical surface treatment include plating treatments such as nickel plating and copper-zinc alloy plating, and treatments with surface treatment agents such as aluminum alcoholates, aluminum chelates and silane coupling agents. Preferable among these are surface treatments with silane coupling agents. Silane coupling agents containing amino groups can be preferably used as the silane coupling agents. On the other hands, examples of the mechanical surface treatment include surface roughening treatment.

The thickness of the conductor layer is not particularly limited, and is preferably 5 µm or more and 30 µm or less.

No particular constraint is imposed on the insulating layers as long as the insulating layers are films made of a nonthermoplastic polyimide resin; however, the insulating layers are preferably films made of an aromatic polyimide having a glass transition temperature of 300° C. or higher as measured by a thermomechanical analyzer (TMA). Examples of the aromatic polyimide having such thermal properties include polyimides having the structure represented by the following structural formula (1):

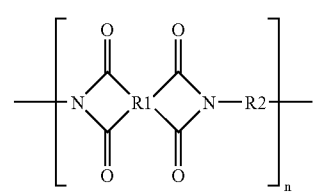

(1)

Here, $R_1$ represents a tetravalent aromatic residue and $R_2$ represents a divalent aromatic residue.

The conductor layers are directly stacked on the films constituting the insulating layers, and such films can be manufactured in such a way that a polyimide precursor solution is applied onto the conductor, and then dried and subjected to thermosetting. The polyimide precursor is a compound which has the above described structural formula (1) after thermosetting, and any such compounds can be used as the precursor concerned. Examples of the polyimide precursor include, for example, polyamic acid represented by the following structural formula (2a) or a combination, represented by the following structural formula (2b), of diamine-terminated polyamic acid with tetracarboxyolic acid or a diester of the tetracarboxylic acid:

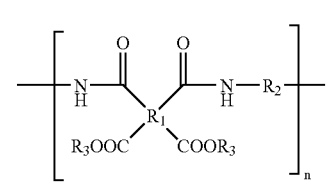

(2a)

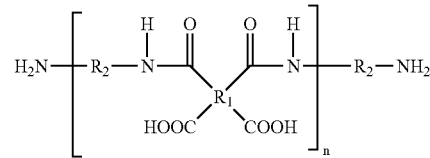

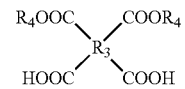

(2b)

Here, $R_1$ represents a tetravalent aromatic residue, $R_2$ represents a divalent aromatic residue, $R_3$ represents a tetravalent aromatic residue, and $R_4$ represents a hydrogen atom or an alkyl group.

Examples of the solvent to be used for the polyimide precursor solution include, for example, a proticpolar solvents, ether compounds and water-soluble alcohol compounds.

Examples of the aprotic polar solvents include N-methyl-2-pyrrolidone, N,N-dimethylformamide, N,N-dimethylacetamide, dimethyl sulfoxide and hexamethylphosphoramide, and the like.

Examples of the ether compounds include 2-methoxyethanol, 2-ethoxyethanol, 2-(methoxymethoxy)ethoxyethanol, 2-isopropoxyethanol, 2-butoxyethanol, tetrahydrofurfuryl alcohol, diethylene glycol, diethylene glycol monomethyl ether, diethylene glycol monoethyl ether, diethylene glycol monobutyl ether,triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, diethylene glycol diethyl ether, and the like.

Examples of the water-soluble alcohol compounds include methanol, ethanol, 1-propanol, 2-propanol, tert-butyl alcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol, diacetone alcohol, and the like.

These solvents may be used as admixtures of two or more thereof. Particularly preferable examples of these include, as single solvents, N,N-dimethylacetamide, N-methyl-2-pyrrolidone; and, as mixed solvents, combinations of N,N-dimethylacetamide and N-methyl-2-pyrrolidone, N-methyl-2-pyrrolidone and methanol, N-methyl-2-pyrrolidone and 2-methoxyethanol, and the like.

Now, the method for preparing the polyimide precursor will be described below.

A polyimide precursor solution can be prepared by reacting an aromatic tetracarboxylic dianhydride represented by the following structural formula (3) with an aromatic diamine represented by the following structural formula (4) in the above described solvent, for example, an aprotic polar solvent.

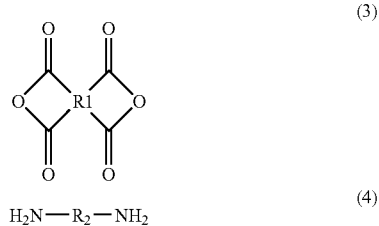

(3)

$$H_2N-R_2-NH_2$$ (4)

Here, as described above, $R_1$ represents a tetravalent aromatic residue and $R_2$ represents a divalent aromatic residue.

In the above described reaction, the proportions of the aromatic tetracarboxylic dianhydride and the aromatic diamine are such that the proportion of the aromatic tetracarboxylic dianhydride falls preferably in a range from 1.03 to 0.97 mol and more preferably in a range from 1.01 to 0.99 mol, in relation to 1 mol of the aromatic diamine; and the reaction temperature is set preferably in a range from −30 to 60° C., and more preferably in a range from −20 to 40° C.

In the above described reaction, no particular constraint is imposed on the mixing order of the monomers and the solvent, and any order may be adopted. When a mixed solvent is used as solvent, the polyimide precursor can also be obtained as follows: the individual monomers are dissolved or suspended respectively in the individual solvents; the solutions or suspensions thus obtained are mixed together; and the reaction mixture thus obtained is allowed to react under stirring at a predetermined temperature for a predetermined period of time. Two or more of such polyimide precursor solutions can be used as an admixture thereof.

Specific examples of the aromatic tetracarboxylic dianhydride represented by the above structural formula (3) include the dianhydrides of pyromellitic acid, 3,3',4,4'-biphenyltetracarboxylic acid, 3,3',4,4'-benzophenonetetracarboxylic acid, 3,3',4,4'-diphenylsulfonetetracarboxylic acid, 2,3,3',4'-diphenyl ether tetracarboxylic acid, 2,3,3',4'-benzophenonetetracarboxylic acid, 2,3,6,7-naphthalenetetracarboxylic acid, 1,4,5,7-naphthalenetetracarboxylic acid, 1,2,5,6-naphthalenetetracarboxylic acid, 3,3',4,4'-diphenylmethanetetracarboxylic acid, 2,2-bis(3,4-dicarboxyphenyl)propane, 2,2-bis(3,4-dicarboxyphenyl)hexafluoropropane, 3,4,9,10-tetracarboxyperylene, 2,2-bis[4-(3,4-dicarboxyphenoxy)phenyl]propane, and 2,2-bis[4-(3,4-dicarboxyphenoxy)phenyl]hexafluoropropane. These aromatic tetracarboxylic dianhydrides can also be used as admixtures of two or more thereof. In the present invention, dianhydrides of pyromellitic acid or 3,3',4,4'-biphenyltetracarboxlic acid, or mixtures of these can be particularly preferably used.

Specific examples of the aromatic diamine represented by the above structural formula (4) include p-phenylenediamine, m-phenylenediamine, 3,4'-diaminodiphenyl ether, 4,4'-diaminodiphenyl ether, 4,4'-diaminodiphenylmethane, 3,3'-dimethyl-4,4'-diaminodiphenylmethane, 2,2-bis[4-(4-aminophenoxy)phenyl]propane, 1,2-bis(anilino)ethane, diaminodiphenylsulfone, diaminobenzanilide, diaminobenzoate, diaminodiphenyl sulfide, 2,2-bis(p-aminophenyl)propane, 2,2-bis(p-aminophenyl)hexafluoropropane, 1,5-diaminonaphthalene, diaminotoluene, diaminobenzotrifluoride, 1,4-bis(p-aminophenoxy)benzene, 4,4'-bis(p-aminophenoxy)biphenyl, diaminoanthraquinone, 4,4'-bis(3-aminophenoxyphenyl)diphenylsulfone, 1,3-bis(anilino)hexafluoropropane, 1,4-bis(anilino)octafluorobutane, 1,5-bis(anilino)decafluoropentane, and 1,7-bis(anilino)tetradecafluoroheptane. These aromatic diamines can also be used as admixtures of two or more thereof. In the present invention, p-phenylenediamine or 4,4'-diaminodiphenyl ether, or mixtures of these compounds are particularly preferable.

In the present invention, when the polyimide precursor solution is prepared, an amine, a diamine, a dicarboxylic acid, a tricarboxylic acid, or a derivative of a tetracarboxylic acid, all these each having a polymerizable unsaturated bond, can be added; and thus, crosslinked structure can be formed at the time of thermosetting. Specifically, maleic acid, nadic acid, tetrahydrophtalic acid, ethynylaniline and the like can be used.

It does not give any problem even if the synthesis conditions and drying conditions for the polyimide precursor and other reasons cause partial imidization in the obtained polyimide precursor.

When the polyimide precursor solution is manufactured, another heat resistant resin such as a polyimide resin, a polyamideimide resin or the like, soluble in the above described solvents, maybe mixed in the solution; moreover, for the purpose of improving the adhesiveness (cohesiveness) and the physical properties of the film, small amounts of silane coupling agents and various surfactants may also be added.

By use of the above described polyimide precursor, and according to the following steps, there is manufactured the film made of a nonthermoplastic polyimide resin which film has a conductor layer stacked on one side thereof and constitutes the substrate for a flexible printed wiring board of the present invention.

The above described polyimide precursor solution is applied onto a conductor and dried to form a precursor layer; the layer is subjected to thermosetting for imidization to form a film made of a nonthermoplastic polyimide resin. More specifically, the polyimide precursor solution is applied onto the roughened surface of a conductor having a predetermined thickness in such a way that the film thickness comes to be 5 μm or more on completion of thermosetting; then, the film is subjected to drying treatment to form a coating film of the polyimide precursor. The drying temperature is preferably 200° C. or lower, and more preferably 150° C. or lower. Subsequently, the film is subjected to a heat treatment at temperatures of 150° C. or higher and 500° C. or lower to thermoset the coating film of the precursor, and thus, the imidization is completed. In this way, there is obtained a film made of a nonthermoplastic polyimide resin which film has a conductor stacked on one side thereof.

The polyimide precursor solution may be applied in two or more batches, and finally the thermosetting of the precursor maybe made once. Alternatively, two or more types of polyimide precursor solutions may be used to form a film composed of two or more layers of polyimides. Here, description is made on polyamic acid as the polyimide precursor; with other polyimide precursors, nonthermoplastic polyimide films each with a conductor stacked on one side thereof can be obtained similarly.

For the purpose of industrially applying the polyimide precursor solution onto a conductor, there can be used as a coating machine a die coater, a multilayer die coater, a gravure coater, a comma coater, a reverse roll coater, a doctor blade coater or the like. Examples of the method for thermosetting the applied precursor include a method in which a copper foil coated with the precursor is heated as wound in a roll in an atmosphere of an inert gas in a furnace, and a method in which a heating zone is provided along the manufacturing line.

Thereafter, the adhesive layer made of an epoxy resin composition is formed on the film surface of the polyimide film manufactured as described above. No particular constraint is imposed on the epoxy resin composition; however, an epoxy resin composition having a glass transition temperature of 190° C. or higher as measured after setting with a dynamic mechanical analyzer (DMA) may be preferably used.

The epoxy resin composition having such a glass transition temperature contains a phenolic hydroxy group-containing polyamide, an aromatic epoxy resin and a curing agent.

No particular constraint is imposed on the phenolic hydroxy group-containing polyamide composing the epoxy resin composition as long as the polyamide contains one or more phenolic hydroxy groups in the molecular structure thereof; however, the polyamide concerned is preferably a phenolic hydroxy group-containing polyamide having the segment represented by the following structural formula (5):

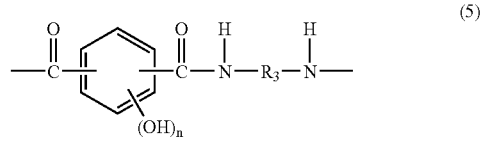

(5)

In formula (5), $R_3$ represents a divalent aromatic group, differing from $R_3$ in each of formulas (2a) and (2b); and n represents an average number of the substituents and is an integer of 1 to 4.

The phenolic hydroxy group-containing polyamide preferably contains, as the —$R_3$-group in the segment of formula (5), one or more of the aromatic residues represented by the following formula (6):

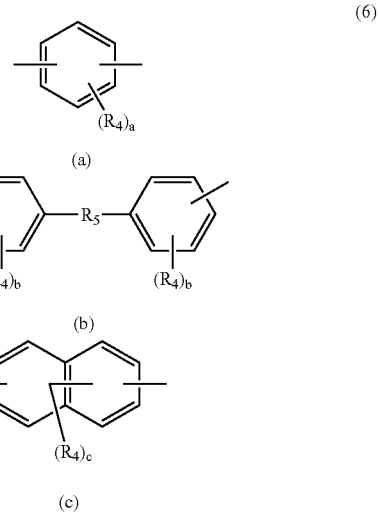

(6)

In formula (6), $R_4$ represents a hydrogen atom, or a substituent having 0 to 6 carbon atoms which substituent may contain O, S, P, F and Si, differing from $R_4$ in formula (2b); $R_5$ represents a direct bond or bonds constituted with 0 to 6 carbon atoms which bonds may contain O, N, S, P, F and Si; and a, b and c each represents an average number of the substituents, a and b each being an integer of 0 to 4, and c being an integer of 0 to 6.

The phenolic hydroxy group-containing polyamide is particularly preferably a phenolic hydroxy group-containing rubber-modified polyamide having an elastomer segment in addition to the above described aromatic polyamide segment. The elastomer is preferably a poly(butadiene-acrylonitrile) copolymer.

The phenolic hydroxy group-containing polyamide is usually obtained by reacting by using a condensing agent a phenolic hydroxy group-containing dicarboxylic acid with an aromatic diamine, and as the case maybe, under further addition of another aromatic dicarboxylic acid, a carboxylic acid-terminated poly (butadiene-acrylonitrile) copolymer and an amine-terminatedpoly(butadiene-acrylonitrile) copolymer.

Specific examples of the phenolic hydroxy group-containing dicarboxylic acid include hydroxyisophthalic acid, dihydroxyisophthalic acid, hydroxyterephthalic acid, dihydroxyterephthalic acid, hydroxyphthalic acid and dihydroxyphthalic acid. Preferable among these are 5-hydroxyisophthalic acid, 4-hydroxyisophthalic acid, 2-hydroxyisophthalic acid, 4,6-dihydroxyisophthalic acid, 2-hydroxyterephthalic acid, 2,5-dihydroxyterephthalic acid and 4-hydroxyphthalic acid; and particularly preferable is 5-hydroxyisophthalic acid.

Specific examples of the aromatic diamine include: benzene or naphthalene diamines such as phenylene diamine, diaminotoluene, diaminoxylene, diaminomesitylene, diaminodurene, diaminoazobenzene and diaminonaphthalene; biphenyl diamines such as diaminobiphenyl and diaminodimethoxybiphenyl; phenyl ether diamines such as diaminodiphenyl ether and diaminodimethyldiphenyl ether; phenylmethanediamines such as methylenedianiline, methylenebis(methylaniline), methylenebis(dimethylaniline), methylenebis(methoxyaniline), methylenebis (dimethoxyaniline), methylenebis (ethylaniline), methylenebis(diethylaniline), methylenebis(ethoxyaniline), methylenebis(diethoxyaniline), isopropylidenedianiline and hexafluoroisopropylidenedianiline; benzophenone diamines such as diaminobenzophenone and diaminodimethylbenzophenone; and diaminoanthraquinone, diaminodiphenyl thioether, diaminodimethyldiphenyl thioether, diaminodiphenyl sulfone, diaminodiphenyl sulfoxide and diaminofluorene; preferable among these are phenyl ether diamines and phenylmethane diamines, and particularly preferable are diaminodiphenyl ether and methylenedianiline.

Specific examples of other aromatic dicarboxylic acids include isophthalic acid, terephthalic acid, biphenyldicarboxylic acid, oxydibenzoic acid, thiodibenzoic acid, dithiodibenzoic acid, carbonyldibenzoic acid, sulfonyldibenzoic acid, naphthalene dicarboxylic acid, methylene dibenzoic acid, isopropylidene dibenzoic acid and hexafluoroisopropylidene dibenzoic acid; preferable among these are isophthalic acid, terephthalic acid, biphenyldicarboxylic acid, oxydibenzoic acid and naphthalene dicarboxylic acid, and particularly preferable is isophthalic acid. When these dicarboxylic acids are used, it is preferable that they are used in combination with the phenolic hydroxy group-containing dicarboxylic acid in a content of 95 mol % or less in relation to the phenolic hydroxy group-containing dicarboxylic acid.

Specific examples of the carboxylic acid-terminated poly (butadiene-acrylonitrile) copolymer include Hycar CT Polymer (trade name; manufactured by Ube Industries, Ltd.), and particularly, Hycar CT Polymer numbered as CTBN-1300x8 is preferable.

Specific examples of the amine-terminated poly(butadiene-acrylonitrile) copolymer include Hycar AT Polymer (trade name; manufactured by Ube Industries, Ltd.) numbered as ATBN-1300×16.

When the carboxylic acid-terminated or amine-terminated poly(butadiene-acrylonitrile) copolymer is used, the copolymer concerned is preferably prepared so as for the content thereof to be 20 to 80% by mass in relation to the rubber-modified phenolic hydroxy group-containing polyamide to be obtained. The amount of the carboxylic acid compound to be used preferably falls in a range from 0.9 to 1.1 mol in relation to 1.0 mol of the aromatic diamine to be used.

Specific examples of the condensing agent include, for example, the phosphites described in Japanese Patent No. 1957919. The condensation reaction is usually carried out by reacting the aromatic diamine component and the dicarboxylic acid component with each other in the presence of one of these condensing agents, in an inert solvent if necessary, and under further addition of a phosphite and a tertiary amine.

Specific examples of the phosphites include triphenyl phosphite, diphenyl phosphite, tri-o-tolyl phosphite, di-o-tolyl phosphite, tri-m-tolyl phosphite, tri-p-tolyl phosphite, di-p-tolyl phosphite, di-p-chlorophenyl phosphite, tri-p-chlorophenyl phosphite and di-p-chlorophenyl phosphite; two or more of these can be added; and triphenyl phosphite is particularly preferable. The amount of the phosphite to be used is usually 1.0 to 3.0 mol and preferably 1.5 to 2.5 mol, in relation to 1.0 mol of the aromatic diamine compound.

Examples of the tertiary amine to be used in combination with the phosphite include pyridine and pyridine derivatives such as 2-picoline, 3-picoline, 4-picoline and 2,4-lutidine. The amount of the tertiary amine to be used is usually 1.0 to 4.0 mol and preferably 2.0 to 3.0 mol in relation to 1.0 mol of the diamine compound to be used.

The above described condensation reaction is generally conducted in an inert solvent. It is desirable that the inert solvent does not substantially react with the phosphite, has characteristics to satisfactorily dissolve the aromatic diamine compound and the dicarboxylic acid, and is a good solvent for the polyamide as the reaction product. Examples of such a solvent include aprotic polar solvents such as N-methyl-2-pyrrolidone, N,N-dimethylacetamide, N,N-dimethylformamide, N-methylcaprolactam, N,N-dimethylimidazolidone, dimethyl sulfoxide, tetramethyl urea and pyridine; nonpolar solvents such as toluene, hexane and heptane; tetrahydrofuran, diglyme, dioxane and trioxane; and mixed solvents of these solvents. Particularly preferable is pyridine alone or a mixed solvent composed of pyridine and N-methyl-2-pyrrolidone wherein pyridine doubles as the above described tertiary amine. The amount of each of these solvents to be used is usually 500 ml or less and preferably 50 to 300 ml in relation to 0.1 mol of the aromatic diamine compound.

For the purpose of obtaining a polyamide with a high degree of polymerization, it is preferable to add inorganic salts such as lithium chloride and calcium chloride in addition to the phosphite, tertiary amine and inert solvent. The amount of such a salt to be added is usually 0.1 to 2.0 mol and preferably 0.2 to 1.0 mol in relation to 1.0 mol of the aromatic diamine to be used.

The method for manufacturing the phenolic hydroxy group-containing polyamide will be described below more specifically. At the beginning, an inorganic salt is added if necessary in an organic solvent containing a tertiary amine, then a phenolic hydroxy group-containing dicarboxylic acid is added, and another aromatic dicarboxylic acid is added as the case may be; to this reaction solution, 50 to 200 mol % of an aromatic diamine is added in relation to 100 mol % of the added dicarboxylic acid component, and the reaction solution is allowed to react while a phosphite is added dropwise in an atmosphere of an inert gas such as nitrogen under heating and stirring, and thus a phenolic hydroxy group-containing polyamide can be obtained. Subsequently, as the case may be, a carboxylic acid-terminated or amine-terminated poly(butadiene-acrylonitrile) copolymer is added dropwise directly or as a solution obtained by diluting the copolymer with an organic solvent, and the reaction solution is allowed to react; thus, a rubber-modified phenolic hydroxy group-containing polyamide can be obtained. The reaction temperature is usually 30 to 180° C. and preferably 80 to 130° C. The reaction time is usually 30 minutes to 24 hours and preferably 1 to 10 hours.

On completion of the reaction, the reaction mixture is poured into a non-solvent such as water or methanol to separate the polymer, and then, by-products, inorganic salts and the like are removed by purification based on reprecipitation or the like; thus, a phenolic hydroxy group-containing polyamide can be obtained.

Now, the epoxy resin composition to be used in the present invention will be described below.

The epoxy resin composition in the present invention contains an aromatic epoxy resin, the above described phenolic hydroxy group-containing polyamide, and a curing agent other than the phenolic hydroxy group-containing polyamide.

No particular constraint is imposed on the aromatic epoxy resin composing the epoxy resin composition as long as the aromatic epoxy resin is an aromatic compound having two or more epoxy groups in one molecule thereof. Specific examples of such an aromatic epoxy resin include novolac epoxy resin, xylylene skeleton-containing phenolic novolac epoxy resin, biphenyl skeleton-containing novolac epoxy resin, bisphenol-A epoxy resin, bisphenol-F epoxy resin, and tetramethylbiphenol epoxy resin. Preferable among these is biphenyl skeleton-containing novolac epoxy resin. Examples of biphenyl skeleton-containing novolac epoxy resin include the products numbered as NC-3000 and NC-3000H manufactured by Nippon Kayaku Co., Ltd.

Examples of the curing agent composing the epoxy resin composition include diaminodiphenylmethane, diethylenetriamine, triethylenetetramine, diaminodiphenyl sulfone, isophorone diamine, dicyandiamide, polyamide resin synthesized from linolenic acid dimer and ethylenediamine, phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, phenol novolac, triphenylmethane and modified products thereof, imidazole, $BF_3$-amine complexes, and guanidine derivatives. However, the present invention is not limited to these examples.

The amount of the curing agent is preferably set in such a way that the proportion of the phenolic hydroxy group-containing polyamide is usually 20% by mass or more and preferably 30% by mass or more in relation to the total mass of the phenolic hydroxy group-containing polyamide and the curing agent, and the total amount of the active hydrogen in the polyamide and the active hydrogen in the curing agent is 0.7 to 1.2 equivalents in relation to 1 equivalent of the epoxy group in the aromatic epoxy resin. When the total amount of the active hydrogen is less than 0.7 equivalent or exceeds 1.2 equivalents in relation to 1 equivalent of the epoxy group, the setting comes to be imperfect and hence satisfactory setting properties cannot be attained.

In the epoxy resin composition, a setting accelerator and the like may be used additionally in combination with the phenolic hydroxy group-containing polyamide, aromatic epoxy resin and curing agent.

Specific examples of the setting accelerator include, for example, imidazoles such as 2-methylimidazole, 2-ethylimidazole and 2-ethyl-4-methylimidazole; tertiary amines such as 2-(dimethylaminomethyl)phenol and 1,8-diaza-bicyclo(5, 4,0)undecene-7; phosphines such as triphenylphosphine; and metal compounds such as tin octylate. The setting accelerator is used if necessary in an amount of 0.1 to 5.0 parts by mass in relation to 100 parts by mass of the epoxy resin.

The method for preparing the epoxy resin composition as the adhesive layer will be described below more specifically. At the beginning, the aromatic epoxy resin and the curing agent are added to and dissolved in a solvent capable of dissolving and/or dispersing without aggregation the ingredients in the epoxy resin composition such as N-methyl-2-pyrolidone, N,N-dimethylformamide, N,N-dimethylacetamide, dimethyl sulfoxide, sulfolane, tetramethylurea, γ-butyrolactone, tetrahydrofuran, cyclohexanone, cyclopentanone, diethylene glycol dimethyl ether, diethylene glycol diethyl ether, triethylene glycol dimethyl ether, 1,4-dioxane, ethyl cellosolve acetate, toluene, xylene, diethylbenzene, cyclohexane, methyl ethyl ketone, methyl isobutyl ketone, and acetophenone; and thereafter, the phenolic hydroxy group-containing polyamide is added and dissolved. A setting accelerator is further dissolved and/or dispersed if necessary, and thus, a varnish composed of the epoxy resin composition can be obtained. As the solvent, aprotic polar solvents are preferably used from the viewpoint of solubility and the like. These solvents may be used each alone or in combinations of two or more thereof.

No particular constraint is imposed on the temperature for preparing the varnish; however, the preparation temperature concerned falls usually in a range from 0 to 70° C. and preferably in a range from 20 to 40° C. At temperatures of 70° C. or higher, the solvent tends to be easily evaporated to necessitate careful control over the concentration, and the reaction between the epoxy resin with phenolic hydroxy group-containing polyamide and/or the curing agent is accelerated as the case may be. On the other hand, at temperatures of 0° C. or lower, the viscosity increase comes to be large to limit the solid content concentration in the varnish.

No particular constraint is imposed on the solid content concentration, exclusive of the solvent, in the varnish including the epoxy resin, phenolic hydroxy group-containing polyamide, curing agent and the like; however, the solid content concentration in total falls in a range from 5 to 75% by mass, preferably in a range from 10 to 60% by mass, and particularly preferably in a range from 10 to 50% by mass. No particular constraint is imposed on the preparation time; the preparation time is optionally selected within a time range in which the individual ingredients are homogeneously dissolved and/or dispersed.

Examples of the most preferable composition for the varnish in the present invention include a combination including a biphenyl skeleton-containing epoxy resin, a rubber-modified hydroxyisophthalic acid-phenyl ether diamine copolymer (a phenolic hydroxy group-containing polyamide), a curing agent and a solvent. The composition proportions of this case are preferably set in such a way that, in relation to 1 equivalent of the epoxy group in the biphenyl skeleton-containing epoxy resin, the total amount of the active hydrogen in the polyamide and the active hydrogen in the curing agent is 0.75 to 1.25 equivalents. In this preferable composition, the proportions of the curing agent and the polyamide are such that the proportion of the polyamide is preferably 70% by mass or more and more preferably falls in a range from 80 to 95% by mass in relation to the total mass of these two components. Additionally, in this preferable composition, the amount of the solvent is preferably such that the solid content concentration exclusive of the solvent falls in a range from 35 to 50% by mass.

EXAMPLES

The present invention will be specifically described below with reference to examples. However, the present invention is not limited to these examples. In the following examples and comparative examples, the measurement methods of the values of various physical properties and raw materials are as follows:

[1] Measurement Methods (1) Adhesion strength (N/cm): The mutual adhesion strength of the insulating layers in a substrate was measured with a Tensiron tester (high-precision multipurpose material tester Model 2020manufactured by Intesco Co., Ltd.). For measurement, a substrate was cut into a 10 mm wide, 100 mm long specimen; the surface of one conductor layer of the specimen was fixed to an aluminum plate by use of a double sided adhesive tape with an adhesives applied onto both sides; then, the insulating layer provided with the conductor layer other than the conductor layer fixed to the aluminum plate was pulled along the 180 degree direction at a rate of 50 mm/min to be separated from the other insulating layer and thus the adhesion strength was measured.

(2) Coefficient of linear thermal expansion [CTE] (ppm) and glass transition temperature [Tg] (° C.): A prepared substrate was soaked in an aqueous solution of ferric chloride, the copper foils as the conductor layers were subjected to etching with the aqueous solution of ferric chloride over the whole surface thereof to remove the conductor layers completely from the substrate. The coefficient of linear thermal expansion of and the glass transition temperature of the insulating layers obtained after etching were measured with a thermomechanical analyzer (TMA: manufactured by TA Instrument Ltd., Model TMA 2940).

(3) Dimension variation rate (%) A 10 mm wide, 200 mm long specimen was prepared, and the specimen was soaked in an aqueous solution of ferric chloride, the copper foils as the conductor layers were subjected to etching over the whole surface thereof to remove the conductor layers completely from the substrate. Then, the dimension variation rate was derived from the dimensions of the specimen measured before etching, after etching and after a heat treatment at 150° C. for 30 minutes further carried out after etching. The dimensional measurement of the specimen was carried out with a digital measuring microscope (manufactured by Nippon Optical Works Co., Ltd., model NRM-D-2XZ).

(4) Curling properties: Three 100 mm long, 100 mm wide specimens were prepared; obtained from these three specimens were a specimen not subjected to etching, a specimen in which the copper foils as the conductor layers were completely removed from the substrate by soaking the specimen in an aqueous solution of ferric chloride to etch the whole surface of the copper foils, and a specimen subjected to a heat treatment at 150° C. for 30 minutes after the aforementioned etching treatment; these specimens were allowed to stand in an atmosphere of 23° C. and 60% RH for 24 hours, and then the curvature radius of each of the specimens was measured and the curling properties were evaluated on the basis of the following four grades:

Excellent (E): Curvature radius of 80 mm or more
Good (G): Curvature radius of 50 mm or more and less than 80 mm
Medium (M): Curvature radius of 20 mm or more and less than 50 mm
Poor (P): Curvature radius less than 20 mm (5) Bending endurance: This serves as an index for the endurance to repeated bending, the bending endurance of the bent surface was measured according to the method described in JIS C-5016 at a curvature radius of 0.8 mm, and the result was evaluated on the basis of the following three grades:

Good (G): Repeated bending cycles of 400 or more
Medium (M): Repeated bending cycles of 200 to 399
Poor (P): Repeated bending cycles of 0 to 199

[2] Raw Materials

In advance of measurements, the solution of the precursor of the nonthermoplastic polyimide to form the insulating layer was synthesized, and the phenolic hydroxy group-containing polyamide and the epoxy resin composition, both to form the adhesive layer, were prepared. The terms used in the following descriptions are as follows.

(Reaction Components)
BPDA: 3,3',4,4'-biphenyltetracarboxylic dianhydride
DAPE: 4,4'-diaminodiphenyl ether
PDA: p-phenylenediamine (Solvents)
DMAc: N,N-dimethylacetamide
NMP: N-methyl-2-pyrrolidone (1) Synthesis of Polyimide Precursor Solution (A)

Under a flow of nitrogen gas, 30.03 g (0.15 mol) of DAPE and 91.92 g (0.85 mol) of PDA, 2330 g of DMAC and 999 g of NMP were placed in a three-necked flask; the flask was placed in an ice water bath and the contents in the flask were stirred for 30 minutes. Then, 294.22 g (1.00 mol) of BPDA was added into the flask and the mixture thus obtained was stirred in a warm water bath at 40° C. for 1 hour to yield a homogeneous solution of polyamic acid. This is referred to as the polyimide precursor solution (A).

(2) Synthesis of Polyimide Precursor Solution (B) Under a flow of nitrogen gas, 18.38 g (62.5 mmol) of BPDA was placed in a three-necked flask and 122.5 g of DMAc was added to dissolve BPDA. To this solution, 6.62 g (61.2 mmol) of PDA and 52.5 g of NMP were added, and the mixture was stirred at room temperature for one night to yield a homogeneous solution of polyamic acid having a solid content concentration of 12.5% by mass. This is referred to as the polyimide precursor solution (B).

(3) Synthesis of a Phenolic Hydroxy Group-Containing Polyamide

In a 500 mL reaction vessel equipped with a thermometer, a reflux condenser, a dropping funnel, a nitrogen introduction port and a stirrer, 224.3 g of N-methyl-2-pyrrolidone and 22.50 g of pyridine were placed; to this mixture, under stirring while flowing dry nitrogen, 2.325 g (0.0128 mol) of 5-hydroxyisophthalic acid, 12.650 g (0.0761 mol) of isophthalic acid, 20.130 g (0.1005 mol) of 3,4'-diaminodiphenyl ether and 1.90 g of lithium chloride were added; and the mixture was slowly heated until the temperature inside the reaction vessel reached 95° C. to dissolve the solid content. Thereafter, while the mixture inside the reaction vessel was stirred to maintain the temperature inside the reaction vessel at 95° C., 48.75 g of triphenyl phosphite was added dropwise over a period of 2 hours, and the mixture was further allowed to react for 2 hours. Then, while maintaining at 95° C., a solution obtained by dissolving 31.50 g (0.0088 mol) of CTBN-1300×8 (manufactured by Ube Industries, Ltd.) in 31.50 g of N-methyl-2-pyrrolidone was added dropwise to the mixture over a period of 30 minutes, and the mixture was allowed to react further for 2 hours.

On completion of the reaction, the reaction solution was cooled down to room temperature, and 120 g of distilled water was added slowly under stirring; 1,000 g of distilled water was placed in a 2,000 mL vessel, and then the cooled reaction solution was added into the distilled water under vigorous stirring to precipitate the product. The precipitate was filtered out; then, 300 g of methanol and 200 g of distilled water were placed in a 1,000 mL reaction vessel, and the precipitate was slowly added under stirring into the mixture of distilled water and methanol; the mixture thus obtained was heated to 60° C., stirred for 2 hours to wash the precipitate, and then the mixture was cooled down to room temperature and filtered. Thereafter, 500 g of distilled water was placed in a 1,000 mL reaction vessel, and the filtered precipitate was slowly added into the distilled water and the temperature was increased up to 90° C.; then the mixture was stirred for 2 hours to wash the precipitate and then the mixture was cooled down to room temperature; then the mixture was filtered out, and the precipitate thus obtained was dried to yield a rubber-modified phenolic hydroxy group-containing polyamide represented by the following formula (7):

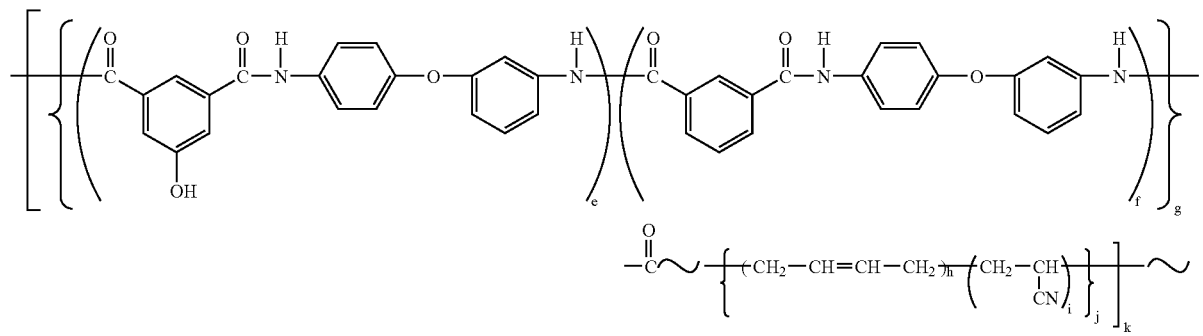

(7)

The amount of the obtained, rubber-modified phenolic hydroxy group-containing polyamide was 62 g, the logarithmic viscosity number of the polyamide concerned was 0.47 dl/g (dimethylacetamide solution, 30° C.); in formula (7), e, f, g, h, i, j and k each represent an average degree of polymerization, with e:f=1:6; the weight average molecular weight of the polyamide concerned was 40,000.

(4) Preparation of Epoxy Resin Composition

In a 2 L vessel equipped with a stirrer and a condenser, a mixed solvent composed of 320 parts by mass of methyl ethyl ketone and 80 parts by mass of N-methyl-2-pyrrolidone were placed; in this mixed solvent, 60 parts by mass of an epoxy resin NC-3000H (manufactured by Nippon Kayaku Co., Ltd.; epoxy equivalent: 289 g/eq; softening temperature: 58° C.; average repetition number: 2.5) and 28.5 parts by mass of a phenol aralkyl resin (trade name: Xyloc XLC-3L; manufactured by Mitsui Chemicals, Inc.; hydroxyl group equivalent: 173 g/eq) as a curing agent were added, and were completely dissolved at a temperature of 30° C. in a required time of 1 hour. Then, 210 parts by mass of the rubber-modified phenolic hydroxy group-containing polyamide obtained in the above (3) was divided into 4 batches, and the four batches were added one by one every 15 minutes to the reaction solution; then, the polyamide concerned was dissolved at a temperature of 30° C. in a required time of 4 hours under stirring. Next, 1.2 parts by mass of an imidazole derivative (2PHZ-PW; manufactured by Shikoku Chemicals Corp.) as a setting accelerator was added to the solution and dispersed sufficiently over a period of 1 hour to yield the epoxy resin composition in the present invention.

Example 1

An electrolytically obtained 18 μm thick copper foil was secured in a metal frame; and the polyimide precursor solution (A) was applied with a bar coater onto the copper foil so as for the coating thickness to be 7 μm after thermosetting, and dried at 130° C. for 10 minutes. Then, the temperature was increased from 100° C. to 360° C. over 2 hours, and then the coated copper foil was heat treated at 360° C. for 2 hours to imidize the polyimide precursor through thermosetting, and thus a polyimide film with a copper foil stacked thereon was obtained.

Next, on the film surface of the polyimide film with a copper foil stacked thereon, a varnish composed of an epoxy resin composition prepared as described above was applied with an applicator having a clearance of 20 μm, and dried at 100° C. for 10 minutes to form a 3 μm thick B-staged adhesive layer made of an epoxy resin composition; thus a three layer-structured laminate film, namely, a conductor layer/insulating layer/adhesive layer laminate film was obtained. Two sheets of such films were stacked on each other so as for the adhesive layers thereof to face each other, pressed so as for the pressure per unit area to be 2.9 MPa, heated from room temperature up to 170° C. in a required time of 30 minutes, and further maintained at 170° C. for 1 hour to be bonded to each other and set.

In the thus obtained five layer-structured laminate film, namely, the conductor layer/insulating layer/adhesive layer/insulating layer/conductor layer laminate film, the thickness of each of the conductor layers was 18 μm, the total thickness of the insulating layers disposed respectively on both sides of the adhesive layer was 14 μm, the thickness of the adhesive layer was 6 μm and the total thickness of the film was 56 μm.

The physical properties and the like of this substrate for a flexible printed wiring board are shown in Table 1.

TABLE 1

| | Insulating layer | | | | | | Dimension variation rate (%) | | Curling properties | | | |
|---|---|---|---|---|---|---|---|---|---|---|---|---|
| | Thickness (μm) | Total thickness (μm) | Tg (° C.) | Thickness of adhesive layer (μm) | Thickness of FP substrate (μm) | Mutual adhesion strength between insulating layers (N/cm) | CTE (ppm) | After etching | After 150° C. × 30 min | Before etching | After single-side etching | After double-side etching | Bending endurance |
| Example 1 | 7 | 14 | 368 | 6 | 56 | 8.8 | 23 | 0 | 0.02 | E | G | E | G |
| Example 2 | 7 | 14 | >400 | 6 | 56 | 7.0 | 18 | +0.02 | +0.03 | E | E | E | G |

TABLE 1-continued

| | Insulating layer | | | Thickness of FP substrate (μm) | Mutual adhesion strength between insulating layers (N/cm) | CTE (ppm) | Dimension variation rate (%) | | Curling properties | | | Bending endurance |
| | Total | | | | | | | | After | After | | |
| | Thickness (μm) | thickness (μm) | Tg (° C.) | Thickness of adhesive layer (μm) | | | | After etching | After 150° C. × 30 min | Before etching | single-side etching | double-side etching | |
|---|---|---|---|---|---|---|---|---|---|---|---|---|---|
| Example 3 | 14 | 28 | >400 | 6 | 70 | 8.8 | 17 | +0.04 | +0.04 | E | E | E | G |
| Example 4 | 14 | 28 | >400 | 14 | 78 | 7.8 | 23 | 0 | +0.01 | E | G | E | G |
| Comp. Ex. 1 | 14 | 28 | 370 | 2 | 66 | 0.98 | 18 | +0.01 | +0.01 | E | G | E | G |
| Comp. Ex. 2 | 7 | 14 | 365 | 14 | 64 | 7.8 | 30 | −0.08 | −0.06 | E | P | E | P |
| Comp. Ex. 3 | 7 | 14 | >400 | 14 | 64 | 7.8 | 26 | −0.05 | −0.04 | E | M | E | M |

CTE: Coefficient of linear thermal expansion
FP substrate: Substrate for a flexible printed wiring board Example 2

A 56 μm thick substrate for a flexible printed wiring board was obtained in the same manner as in Example 1 except that the polyimide precursor solution (B) was used in place of the polyimide precursor solution (A).used in Example 1.

The physical properties and the like of the obtained substrate for a flexible printed wiring board are shown in Table 1.

Example 3

A 70 μm thick substrate for a flexible printed wiring board was obtained in the same manner as in Example 1 except that the polyimide precursor solution (B) was used in place of the polyimide precursor solution (A) used in Example 1, and the thickness of the insulating layer in the three layer-structured laminate film was set at 14 μm.

The physical properties and the like of the obtained substrate for a flexible printed wiring board are shown in Table 1.

Example 4

A 78 μm thick substrate for a flexible printed wiring board was obtained in the same manner as in Example 1 except that the polyimide precursor solution (B) was used in place of the polyimide precursor solution (A) used in Example 1, and the thicknesses of the insulating layer and the adhesive layer in the three layer-structured laminate film were set at 14 μm and 7 μm, respectively.

The physical properties and the like of the obtained substrate for a flexible printed wiring board are shown in Table 1.

In any one of Examples 1 to 4, the film surfaces of two sheets of films each constituting an insulating layer with a conductor layer on one side thereof were mutually integrated through the intermediary of a specific adhesive layer in such a way that the thickness of each of the insulating layers fell in the range of the present invention, and hence the mutual adhesion strength between the insulating layers was excellent. Additionally, in any one of Examples 1 to 4, there was obtained a substrate for a flexible printed wiring board which substrate was small in CTE and dimension variation rate, excellent in dimensional stability, and also excellent in curling properties and bending endurance.

Comparative Example 1

A 66 μm thick substrate for a flexible printed wiring board was obtained in the same manner as in Example 1 except that the thicknesses of the insulating layer and the adhesive layers in the three layer-structured laminate film were set at 14 μm and 1 μm, respectively.

The physical properties and the like of the obtained substrate for a flexible printed wiring board are shown in Table 1.

Comparative Example 2

A 64 μm thick substrate for a flexible printed wiring board was obtained in the same manner as in Example 1 except that the thickness of the adhesive layer in the three layer-structured laminate film was set at 7 μm.

The physical properties and the like of the obtained substrate for a flexible printed wiring board are shown in Table 1.

Comparative Example 3

A 64 μm thick substrate for a flexible printed wiring board was obtained in the same manner as in Example 1 except that the polyimide precursor solution (B) was used in place of the polyimide precursor solution (A) used in Example 1, and the thickness of the adhesive layer in the three layer-structured laminate film was set at 7 μm.

The physical properties and the like of the obtained substrate for a flexible printed wiring board are shown in Table 1.

In Comparative Example 1, the ratio of the thickness of each of the insulating layers to the thickness of the adhesive layer was too high, and hence the mutual adhesion strength between the insulating layers was low and the mutual adhesion strength between the insulating layers of the present invention was not attained.

In any one of Comparative Examples 2 and 3, the ratio of the thickness of each of the insulating layers to the thickness of the adhesive layer was too low, and hence the dimensional stability, curling properties and bending endurance were poor.

The invention claimed is:
1. A substrate for a flexible printed wiring board, comprising:

an adhesive layer containing an epoxy resin composition;
a pair of insulating layers respectively stacked on both sides of the adhesive layer and formed with a pair of films containing a nonthermoplastic polyimide resin; and
conductor layers respectively disposed on the surfaces of the films opposite from the adhesive layer, wherein
the total thickness of the insulating layers respectively stacked on both sides of the adhesive layer is 10 to 100 µm and 2 to 10 times the thickness of the adhesive layer, and
the mutual adhesion strength between the insulating layers through the adhesive layer is 7.0 N/cm or more.

2. The substrate for a flexible printed wiring board according to claim 1, wherein the epoxy resin composition comprises a phenolic hydroxy group-containing polyamide, an aromatic epoxy resin and a curing agent other than a phenolic hydroxy group-containing polyamide.

3. A method for manufacturing a substrate for a flexible printed wiring board, comprising:
preparing a first insulating layer and a second insulating layer each of which is a film containing a nonthermoplastic polyimide resin and comprises a conductor layer stacked on one side thereof;
applying a varnish containing an epoxy resin composition onto the film surface of at least one of the first and second insulating layers opposite from the conductive layers;
stacking the first insulating layer and the second insulating layer on each other through the varnish in such a way that the film surface of the first insulating layer and the film surface of the second insulating layer are facing each other;
pressure bonding the first insulating layer and the second insulating layer stacked on each other in a heated atmosphere; and
making the total thickness of the first and second insulating layers be 10 to 100 µm and 2 to 10 times the thickness of the adhesive layer formed of the varnish, and making the mutual adhesion strength between the insulating layers through the adhesive layer be 7.0 N/cm or more.

4. The method for manufacturing a substrate for a flexible printed wiring board according to claim 3, wherein the epoxy resin composition comprises a phenolic hydroxy group-containing polyamide, an aromatic epoxy resin and a curing agent.

5. A method for manufacturing a substrate for a flexible printed wiring board, comprising:
preparing as an insulating layer which is a 5 to 50 µm thick film containing a nonthermoplastic polyimide resin and comprises a conductor layer stacked on one side thereof;
producing a laminate film with an adhesive layer formed therein by applying a varnish containing an epoxy resin composition onto the film surface of the insulating layer so as for the thickness of the varnish coating to be 0.1 to 0.5 time the thickness of the insulating layer and by drying the varnish coating;
stacking two such laminate films on each other in such a way that the adhesive layers thereof are facing each other; and
pressure bonding the laminate films to each other in a heated atmosphere so as for the adhesive strength to be 7.0 N/cm or more.

6. The method for manufacturing a substrate for a flexible printed wiring board according to claim 5, wherein the epoxy resin composition comprises a phenolic hydroxy group-containing polyamide, an aromatic epoxy resin and a curing agent.

* * * * *